(12) United States Patent
Hudgens et al.

(10) Patent No.: US 8,269,206 B2
(45) Date of Patent: Sep. 18, 2012

(54) PROCESSING PHASE CHANGE MATERIAL TO IMPROVE PROGRAMMING SPEED

(75) Inventors: Stephen J. Hudgens, Santa Clara, CA (US); Tyler Lowrey, West Augusta, VA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/004,167

(22) Filed: Jan. 11, 2011

(65) Prior Publication Data

US 2011/0168964 A1    Jul. 14, 2011

Related U.S. Application Data

(62) Division of application No. 10/633,873, filed on Aug. 4, 2003, now Pat. No. 7,893,419.

(51) Int. Cl.
*H01L 29/02* (2006.01)

(52) U.S. Cl. ............... 257/2; 257/4; 257/5; 257/E45.001
(58) Field of Classification Search ................. 257/4–5, 257/2; 438/900
See application file for complete search history.

(56) References Cited

U.S. PATENT DOCUMENTS

| | | | |
|---|---|---|---|
| 6,416,837 B1 * | 7/2002 | Kojima et al. | 428/64.1 |
| 6,462,984 B1 * | 10/2002 | Xu et al. | 365/175 |
| 2003/0152867 A1 * | 8/2003 | Ichihara et al. | 430/270.13 |
| 2004/0113181 A1 * | 6/2004 | Wicker | 257/246 |
| 2004/0268064 A1 * | 12/2004 | Rudelic | 711/156 |
| 2006/0193231 A1 * | 8/2006 | Mizuuchi et al. | 369/94 |

* cited by examiner

*Primary Examiner* — A. Sefer
(74) *Attorney, Agent, or Firm* — Trop, Pruner & Hu, P.C.

(57) ABSTRACT

A phase change material may be processed to reduce its microcrystalline grain size and may also be processed to increase the crystallization or set programming speed of the material. For example, material doped with nitrogen to reduce grain size may be doped with titanium to reduce crystallization time.

3 Claims, 4 Drawing Sheets

PROCESSING PHASE CHANGE MATERIAL TO IMPROVE PROGRAMMING SPEED

CROSS-REFERENCE TO RELATED APPLICATIONS

This application is a divisional of U.S. patent application Ser. No. 10/633,873, filed on Aug. 4, 2003 now U.S. Pat. No. 7,893,419.

BACKGROUND

This invention relates generally to the formation of phase change material memories.

Phase change memories use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the material (e.g., crystalline or amorphous).

Thus, there is a need for phase change materials with desirable grain sizes and faster programming speed.

DETAILED DESCRIPTION

Figure 1:
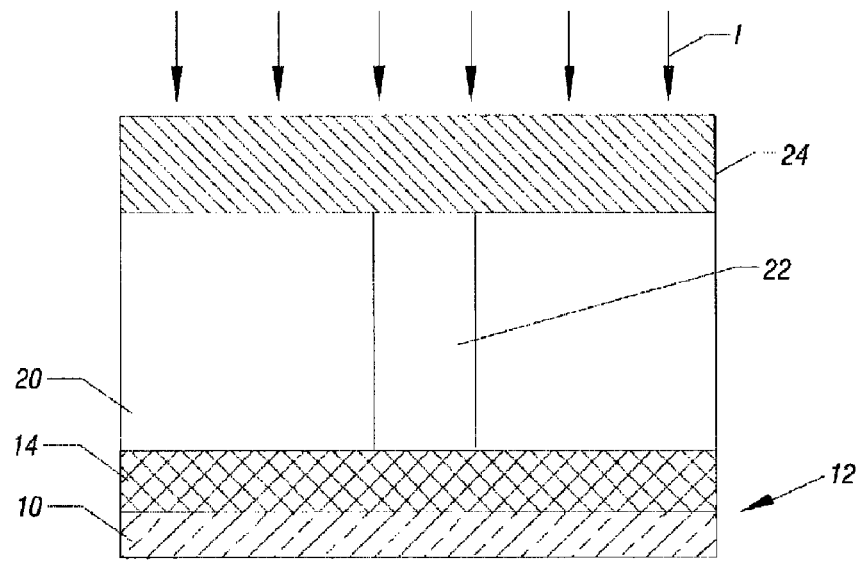
FIG. 1 is an enlarged cross-sectional view of one embodiment of the present invention.

Referring to FIG. 1, a semiconductor substrate 12 may include a first substrate portion 10 and at least a second substrate portion 14. In some embodiments, the substrate portion 10 may be P minus conductivity type material and the substrate portion 14 may be N conductivity type material.

A conductive heater 22 may be defined within an insulator 20 formed over the substrate 12. The heater 22 may, in one embodiment, be formed of tungsten. The heater 22 is for applying heat to a localized region of an overlying chalcogenide or phase change material 24. In one embodiment of the present invention, the material 24 is $Ge_2Sb_2Te_5$, also known as GST.

The phase change material 24 may be doped by adding small amounts of nitrogen or nitrogen and oxygen into the phase change material to control the number and size of the microcrystalline grains produced during crystallization of the material. Nitrogen or nitrogen/oxygen co-doping at concentration levels of about 3 percent to about 6 atomic weight percent may be effective in producing a more uniform distribution of grains having sizes of from approximately 5 nanometers to approximately 10 nanometers of crystalline phase change material. Such grains may be called micrograins.

For example, in one embodiment, a GST material 24 may be deposited by DC magnetron reactive sputtering from a target with a nominal chemical composition of GST. The chemical composition of the starting material 24 may be Ge:Sb:Te=23.0:22.7:44.3 atomic weight percent in one embodiment. The sputtering power may be approximately 100 watts in this example. The background pressure may be less than $1.4 \times 10^{-5}$ Pa and the argon gas pressure may be less than 0.67 Pa, respectively. The nitrogen contents of the GST layer 24 may be in the range of 0 to 12 atomic percent by varying the nitrogen gas flow rate in the range of 0 to 10 sccm, and the argon gas flow rate may be fixed at 100 sccm. These GST material characteristics are given for informational purposes only and are not intended to in any way limit the scope of the claimed invention. Nitrogen doping of GST films is described, for example, in Hun Seo, et al. "Investigation of Crystallization Behavior of Sputter-Deposited Nitrogen-Doped Amorphous $Ge_2Sb_2Te_5$ Thin Films," Jpn. J. Appl. Phys. Vol. 39 (2000) pp. 745-751 (February 2000).

The nitrogen doped micrograin GST exhibits a reduction in the crystallization speed compared to undoped GST. A phase change memory may rely on a reversible crystalline to amorphous phase change in chalcogenide alloy semiconductor as its basic data storage mechanism. A memory bit is programmed into the amorphous (reset) state by the application of a fast (for example, 1 to 10 nanoseconds) current pulse having sufficient amplitude to melt the chalcogenide alloy semiconductor in the programmable volume adjacent to the heater 22. When the reset programming pulse is terminated, the melted volume of chalcogenide cools rapidly enough to freeze into a vitreous (atomically disordered) state that has electrical resistance.

To program the bit into the low resistance microcrystalline (set) state, a lower amplitude pulse is applied that is sufficient to heat the programmable volume to a temperature just below the melting point. The set pulse may be of a sufficient duration to permit the amorphous material in the program volume to crystallize. For standard GST phase change material, this set programming time is approximately 50 nanoseconds.

The reduction in crystallization speed, as a result of nitrogen doping the micrograin GST, may result in unfavorable tradeoffs between programming current and programming speed. Since programming to the set state already involves the longest programming pulse in undoped GST, further increasing the length of the set pulse with nitrogen doped micrograin GST may result in greater energy required for the programming pulse, even though the programming current is reduced. In battery operated portable electronic equipment, for example, programming energy is more important than programming current since programming energy directly impacts useful battery life.

In one embodiment of the present invention, the doping I may include, for example, nitrogen or nitrogen and oxygen to reduce grain size. The doping I may also include co-doping or simultaneous doping with titanium to reduce the set programming time. For example, about 5 atomic percent titanium may be used in one embodiment.

The titanium doping of the material 24 may be accomplished by direct incorporation of titanium into the starting chalcogenide alloy in one embodiment. For example, a sputter target used for physical vapor deposition of the phase change material 24 may incorporate titanium. Alternatively, a thin layer of titanium may be sequentially sputtered before or after the chalcogenide layer has been deposited. In still another embodiment, ion implantation of titanium may be utilized.

Figure 2:
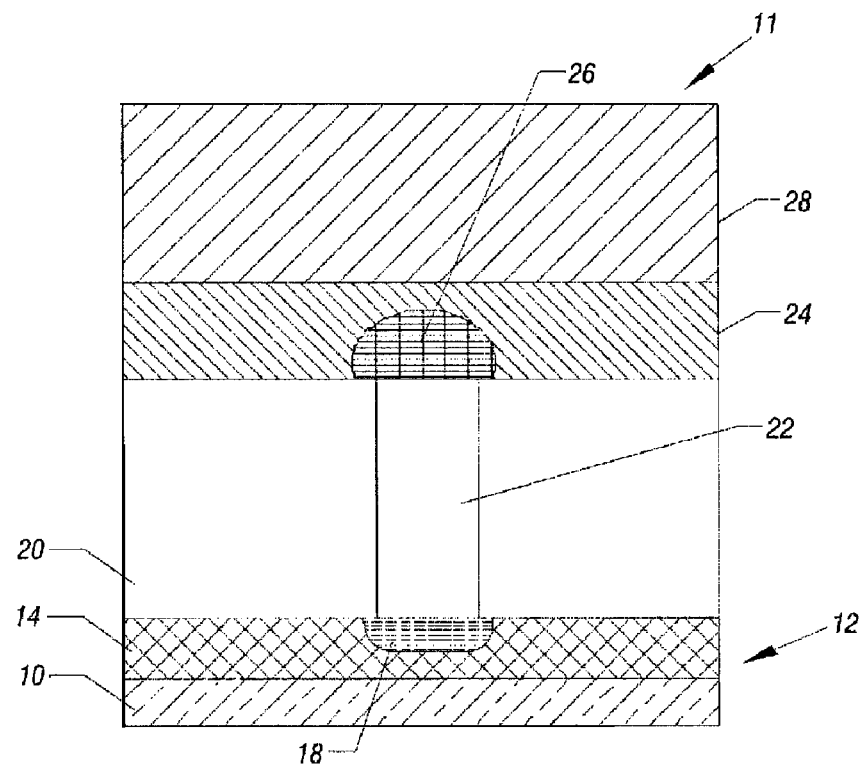
FIG. 2 is an enlarged cross-sectional view of the embodiment shown in FIG. 1 at a subsequent stage of manufacture in accordance with one embodiment of the present invention.

After the material 24 has been appropriately doped to include nitrogen or oxygen, as well as titanium, a metallic interconnect 28 may be applied to form the completed device 11 as shown in FIG. 2. The chalcogenide or phase change material 24 may include a volume made up of polycrystalline chalcogenide and a programmable volume 26 arranged over the heater 22.

Figure 3:
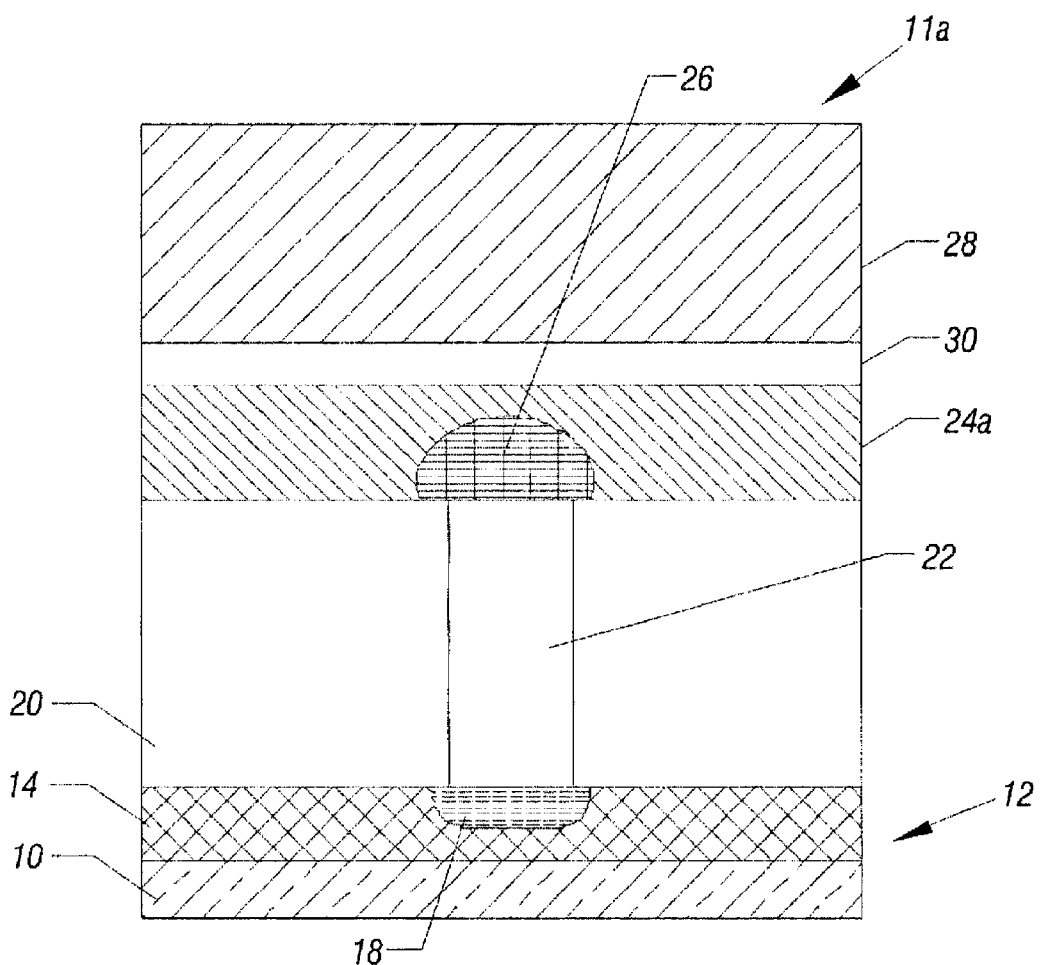
FIG. 3 is an enlarged cross-sectional view at a subsequent stage to FIG. 1 in accordance with still another embodiment of the present invention.

Referring to FIG. 3, in accordance with another embodiment of the present invention, a titanium source layer 30 may be formed over the phase change material layer 24a, which has been doped only with the nitrogen or nitrogen/oxygen co-doping. The metallic interconnect layer 28 may then be formed to result in the structure 11a. Upon heating, for example during semiconductor processing, titanium from the layer 30 diffuses into the phase change material 24a. In one embodiment, a 25 Angstrom titanium film may be used with an 800 Angstrom GST film of phase change material.

Figure 4:
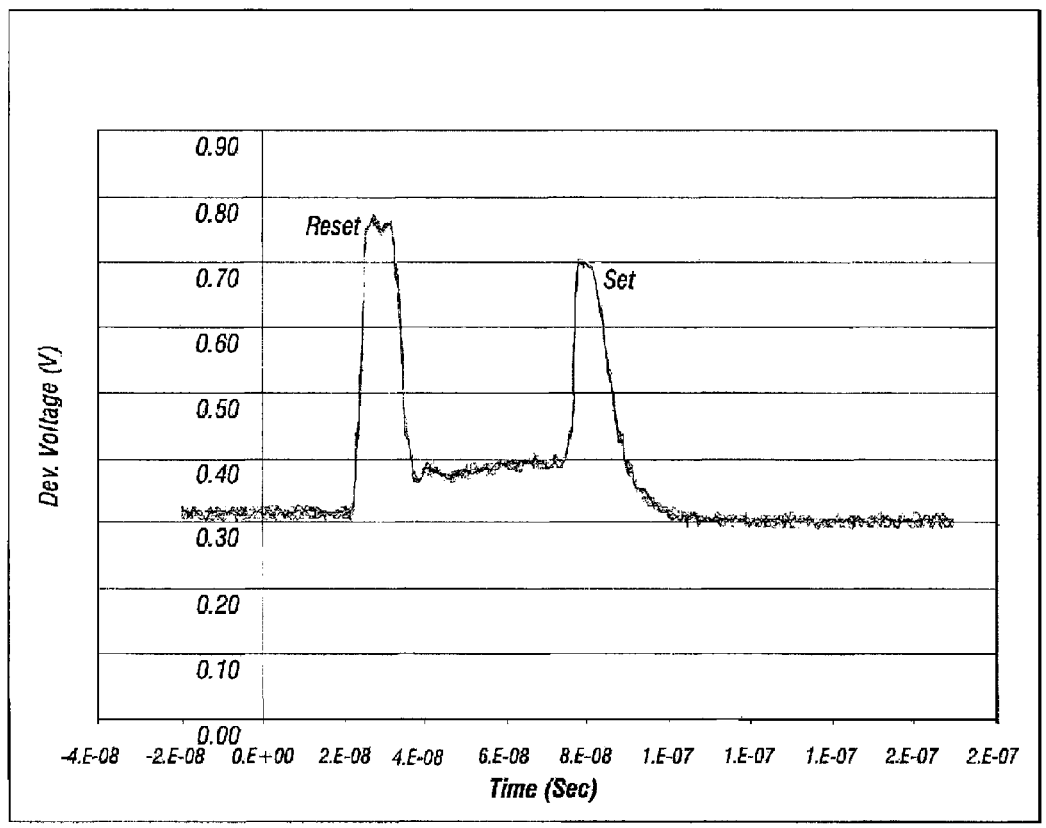
FIG. 4 is a graph of voltage versus time for one embodiment of the present invention.

Referring to FIG. 4, a set pulse of approximately 10 nanoseconds duration is sufficient to program a test bit fabricated with titanium doped GST in one embodiment. Undoped GST devices of the same dimensions use a set pulse duration of approximately 50 nanoseconds or greater.

As shown in FIG. 4, the set time may be reduced. Phase change memories with approximately 400 Angstrom GST layers deposited on a 10 to 20 Angstrom titanium layer may exhibit increases of set speed of greater than five times in one embodiment.

Figure 5:
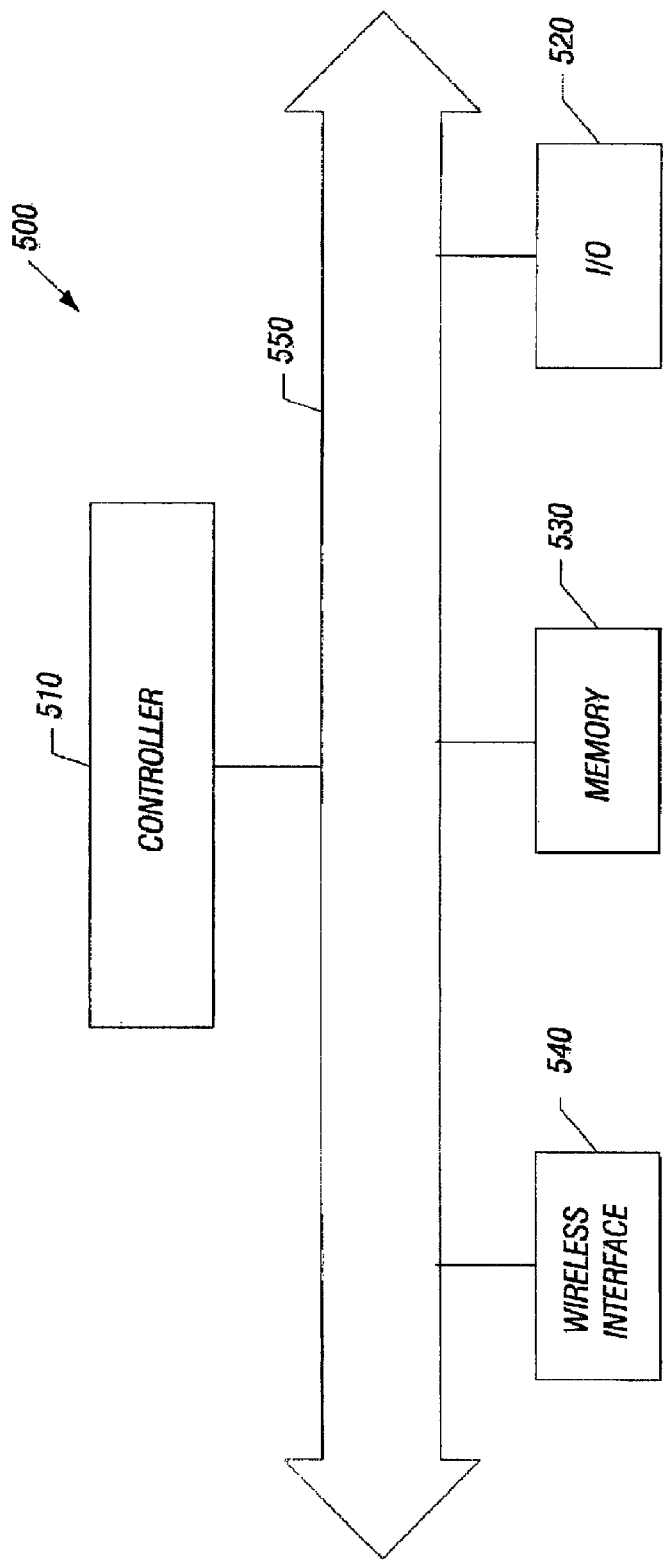
FIG. 5 is a depiction of a system in accordance with one embodiment of the present invention.

Turning to FIG. 5, a portion of the system 500 in accordance with an embodiment of the present invention is described. The system 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. The system 500 may be used in any of the following systems: a wireless local area network (WLAN) system, a wireless personal area network (WPAN) system, or a cellular network, although the scope of the present invention is not limited in this respect.

The system 500 may include a controller 510, an input/output (I/o) device 520 (e.g., a keypad display), a memory 530, and a wireless interface 540 coupled to each other via a bus 550. It should be noted that the scope of the present invention is not limited to embodiments having any or all of these components.

The controller 510 may comprises, for example, one or more microprocessors, digital signal processors, microcontrollers, or the like. The memory 530 may be used to store messages transmitted to or by the system. The memory 530 may also be optionally used to store instructions that are executed by the controller 510. During the operation of the system 500 it may be used to store user data. The memory 530 may be provided by one or more different types of memory. For example, a memory 530 may comprise a volatile memory (any type of random access memory), a non-volatile memory such as a flash memory, and/or phase change memory that includes a memory such as, for example, memory elements 11 or 11a, illustrated in FIGS. 2 and 3.

The I/o device 520 may be utilized to generate a message. The system 500 may use the wireless interface 540 to transmit and receive messages to and from a wireless communication network with a wireless radio frequency (RF) signal. Examples of the wireless interface 540 may include an antenna or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
   a processor-based device;
   a wireless interface coupled to said processor-based device;
   a semiconductor memory coupled to said device, said memory including the substrate, said memory further including a layer of chalcogenide material over said substrate, said chalcogenide material including a species to reduce the grain size of the chalcogenide material and a species to increase the crystallization speed of said chalcogenide material;
   an insulator over said substrate and under said chalcogenide material; and
   a heater extending through said insulator to said chalcogenide material to heat said chalcogenide material.

2. The system of claim 1 wherein the species to reduce grain size includes nitrogen.

3. The system of claim 1 wherein the species to increase crystallization speed includes titanium.

* * * * *